US006929975B2

(12) United States Patent
Heinz et al.

(10) Patent No.: US 6,929,975 B2
(45) Date of Patent: Aug. 16, 2005

(54) METHOD FOR THE PRODUCTION OF AN ELECTRONIC COMPONENT

(75) Inventors: Helmut Heinz, Ansbach (DE); Friedrich Nehmeier, Erlangen (DE); Bernhard Schuch, Neusitz (DE); Hubert Trageser, Nuremberg (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 100 days.

(21) Appl. No.: 10/466,031

(22) PCT Filed: Dec. 10, 2001

(86) PCT No.: PCT/EP01/14463

§ 371 (c)(1), (2), (4) Date: Jul. 11, 2003

(87) PCT Pub. No.: WO02/056652

PCT Pub. Date: Jul. 18, 2002

(65) Prior Publication Data

US 2004/0048414 A1 Mar. 11, 2004

(30) Foreign Application Priority Data

Jan. 13, 2001 (DE) .......................................... 101 01 359

(51) Int. Cl.[7] .............................................. H01L 21/44

(52) U.S. Cl. ........................ 438/106; 438/107; 438/108; 438/109

(58) Field of Search ................................ 438/106–108; 257/734–736, 700, 777, 704–706

(56) References Cited

U.S. PATENT DOCUMENTS

| | | |
|---|---|---|
| 4,493,856 A | 1/1985 | Kumar et al. |
| 4,700,473 A | 10/1987 | Freyman et al. |
| 4,991,359 A | 2/1991 | Ogitani |
| 5,275,330 A | 1/1994 | Isaacs et al. |
| 5,407,864 A | 4/1995 | Kim |
| 5,842,275 A * | 12/1998 | McMillan et al. ............ 29/840 |
| 5,883,335 A * | 3/1999 | Mizumoto et al. .......... 174/266 |
| 6,190,941 B1 * | 2/2001 | Heinz et al. ................ 438/106 |

(Continued)

FOREIGN PATENT DOCUMENTS

| | | |
|---|---|---|
| DE | 2400665 | 7/1975 |
| DE | 3214807 | 10/1983 |
| DE | 3514093 | 10/1986 |
| DE | 19842590 | 4/2000 |
| DE | 19909505 | 9/2000 |
| EP | 0055578 | 7/1982 |
| EP | 0869704 | 10/1998 |
| GB | 2224961 | 5/1990 |
| GB | 2304999 | 3/1997 |
| JP | 3-152993 | 6/1991 |
| JP | 06045734 | 2/1994 |
| JP | 07221447 | 8/1995 |
| JP | 10270590 | 10/1998 |
| JP | 10326847 | 12/1998 |
| JP | 11145592 | 5/1999 |
| WO | WO86/06243 | 10/1986 |
| WO | WO99/67978 | 12/1999 |

*Primary Examiner*—Hoai Pham
*Assistant Examiner*—Nathan W. Ha
(74) *Attorney, Agent, or Firm*—W. F. Fasse; W. G. Fasse

(57) ABSTRACT

Electronic packages are produced as follows. Vias in a support body are closed with a highly viscous screen printing material following application of a first metallizing layer forming a base metallization on the support body and in the lead-throughs for the vias. A low viscosity passivating layer, which has been applied on the entire surface of the top and bottom sides of the support body, is selectively removed from certain areas of the top side. A second metailizing layer forming the final metallization of a low-melting point material is applied to the first metallization layer in the areas from which the passivating layer was removed. Electronic components of the circuit arrangement are applied on the top side of the support body and contacted by a soldering process.

8 Claims, 2 Drawing Sheets

U.S. PATENT DOCUMENTS

| | | |
|---|---|---|
| 6,400,573 B1 | 6/2002 | Mowatt et al. |
| 6,433,419 B2 | 8/2002 | Khandros et al. |
| 6,517,895 B1 | 2/2003 | Wolfer et al. |
| 6,528,343 B1 * | 3/2003 | Kikuchi et al. .............. 438/106 |
| 2002/0106833 A1 * | 8/2002 | Kobayashi .................. 438/108 |

* cited by examiner

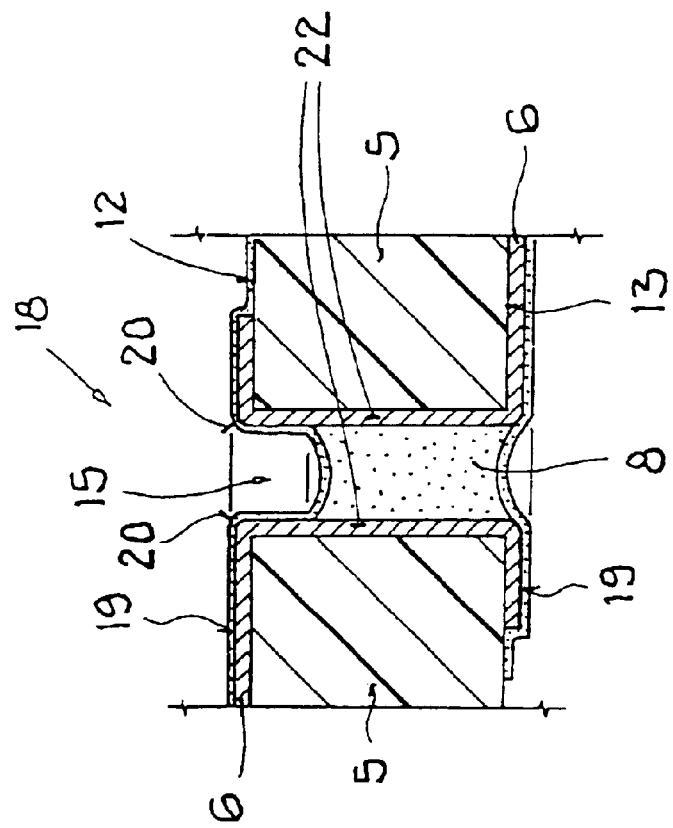
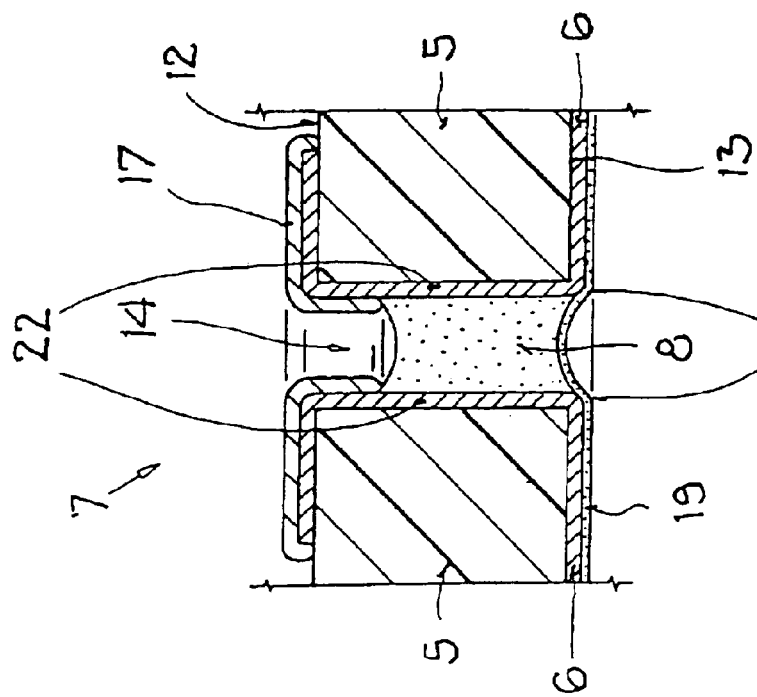

METHOD FOR THE PRODUCTION OF AN ELECTRONIC COMPONENT

CROSS-REFERENCE TO RELATED APPLICATION

This application relates to U.S. application Ser. No. 09/914,932, PCT filed: Mar. 1, 2000, now U.S. Pat. No. 6,820,798, issued Nov. 23, 2004, for "Method for Producing Circuit Arrangements".

FIELD OF THE INVENTION

An electronic package is formed to include a circuit arrangement and at least one electronic component on a support or substrate.

BACKGROUND OF THE INVENTION

Electronic packages are used in many application areas of electrical engineering. These electronic packages comprise circuit arrangements with electronic components. A high power dissipation occurs during operation. This is particularly the case in electronic packages including power components such as power modules for the control of electronic components or of further packages. The components of the circuit arrangement of the electronic package are applied to a suitable support body, for example, power components that are frequently surface mountable are used in power modules. The power components rest with their back side connecting surface on a printed circuit board forming a support body.

The support body for the components of the circuit arrangement frequently comprises vias that are metallized through and through from the top side to the bottom side of the support body. In order to produce an electrical connection from the top side of the support body, that is, from the components of the circuit arrangement and from the metallic printed circuit structure applied there to the bottom side of the support body, electric through contacts, so-called electrical vias are formed in the support body. In order to assure a sufficient heat dissipation of the power loss of the components of the circuit arrangement, particularly of the power loss of the power components, thermal through contacts, so-called thermal vias can be formed in the carrier body for enhancing the vertical heat transport. These thermal vias are particularly arranged directly under the backside connecting surface (or support area) of the structural components, particularly of the power components.

Following the application of the components on the top side of the printed circuit board, namely the insertion side, they are contacted with connecting pads and/or printed circuit conductors in a soldering process, for example in that a soldering paste is printed on the connecting pads and on the surface of the vias, whereupon a reflow soldering process performs a melt-on. Thereby solder or solder spatters, or also melted portions of the metallic printed circuit structure can be pulled by capillary effects through the vias to the bottom side of the support body to thereby cause damages. For example, damage to an electrical insulator that has been applied to the bottom side of the support body can occur, for example by punching through an insulation film or to cause electrical short-circuits to a metallic cooling body that is optionally provided on the bottom side of the carrier body or to a housing that encloses the support body and the circuit arrangement of the electronic package.

German Patent Publications DE 198 42 590 A1 and DE 199 09 505 A1 describe methods for producing circuit arrangements in which all thermal vias formed in the support body from the top side or insertion side of the support body to the opposite bottom side or backside of the carrier bottom are closed by means of screen printing. Thereby, the diameter of the thermal vias is adapted to the respectively applied screen printing technique and so predetermined that a sufficient coverage of the thermal vias takes place within the opening volume. For example, a certain determined minimal filling inside of the thermal vias may be required. However, problems may occur if for the realization of the metallic printed circuit conductor structure and the metallization of the vias materials with a lower melting point or low melting materials are to be used for cost reasons or to obtain a better workability. The metallization in the vias can melt during the soldering process for contacting the components of the circuit arrangement so that as a result the screen printing material in the vias is no longer securely anchored. As a result, undesirable metallic bumps may arise on the bottom side of the support body. These bumps impair the function and reliability of the circuit arrangement.

SUMMARY OF THE INVENTION

It is the object of the invention to provide a simple method for the production of an electronic package for use in a wide range and with advantageous characteristics with regard to the heat dissipation, the reliability, the costs, and the production method.

This object has been achieved according to the invention by the combination of the following steps.

A first metallizing layer, preferably of copper, forming the base metallization is applied to the support body and to the walls of the lead-throughs that are provided in the support body for realizing the electric and thermal vias. Thus, a printed circuit conductor structure including conductor strips and contact pads, as well as vias are formed. Following the application of the first metallizing layer forming the base metallization, a screen printing process is performed for introducing screen printing material into the vias, whereby the screen printing material, which is provided for closing the vias, is printed from the bottom side of the support body into the openings of the electrical and thermal vias and onto the first metallization layer of the base metallization introduced into the lead-throughs. For this highly viscous thixotropic or paste-like materials, preferably free of solvents, are used, whereby the screen printing material can be selected to be compatible with the material of the support body. Particularly, a solid epoxy, free of solvent, preferably a solid epoxy resin, free of solvents, is used which has a minimal volume reduction during curing so that during curing no bubbles or fractures can occur in the screen printing material. Such bubbles or fractures would impair the reliability of the closure of the vias. In connection with the screen printing process a screen printing film is arranged around the wires and the screen printing material is imprinted from the bottom side of the support body into the openings of the vias in order to achieve a certain filling volume in a multi-stage printing operation in at least two stages. Especially a multi-stage screen printing process is employed that takes place "wet-in-wet". The printing operation of the screen printing material into the vias is hereby repeated as often, at least however twice in sequence, until a certain filling volume in the vias has been achieved, i.e. a desired thickness of the screen printing material in the vias and a desired surface area coverage of the openings of the vias with the screen printing material. Hereby, it is not necessary that the entire volume of the vias is filled with screen printing material. However, particularly, the vias should be completely covered with screen printing material in the surface. In the height the screen printing material should fill more than half the height of the vias and thus of the thickness of the support body.

After testing the closure of the vias, for example by means of an optical inspection against light or by means of an automated vacuum test with a determination of the external air proportion for recognizing possibly present holes, the support body is dried and the screen printing material is cured. A cleaning process may be optionally performed following the printing and curing of the screen printing material, whereby remainders of the screen printing material protruding from the support body are removed, whereby on the one hand plane, and on the other hand clean, or shiny surfaces of the support body are formed which make possible an improved working for the following method steps. It is advantageous that for this purpose cleaning processes may be used that are customarily employed in the production of the circuit arrangement, for example mechanical cleaning processes or chemical cleaning processes.

Subsequently, a passivating layer for corrosion protection is applied on both surface sides of the support body, i.e. the top side and the bottom side of the support body. More specifically, the passivating layer is applied onto the first metallization layer which forms the base metallization and onto the screen printing material introduced into the vias. A low viscosity material is used for the passivating layer, particularly a soldering stopping lacquer, for example a diluted solvent containing solid material epoxy, preferably a solvent containing solid material epoxy resin. The layer thickness of the passivating layer that is applied, for example by a screen printing method or by a spraying method is selected on the basis of the criteria heat conductivity on the one hand and coverage on the other hand. The upper limit of the layer thickness is determined by the heat conductivity while the lower limit is determined by the coverage. Stated differently, the passivating layer may not, on the one hand, substantially impair the heat conductivity, i.e. the thermal transition from the top side to the bottom side of the support body. On the other hand, the passivating layer must completely cover the metallization layer that forms the base metallization including the edges of the openings of the vias.

The passivating layer is removed from the areas of the top surface of the support body provided for the soldering process. The removal is performed by a selective process, for example these areas are etched free, particularly the connecting pads of the printed circuit structure and the thermal vias are being freed of the passivating layer so that the first metallizing layer forming the base metallization lies free in these areas. The remaining areas on the top surface of the support body and on the bottom side of the support body remain covered with the passivating layer, i.e. particularly the underside of the support body as well as the sections of the printed circuit structure not intended for the soldering process, where the passivating layer functions as a corrosion protection on the first metallizing layer forming the base metallization.

A further metallization layer is applied to the areas on the top surface of the support body which have been freed of the passivating layer, for passivating and for improving the solderability. The further metallizing layer is made of a material having a low melting point, whereby the material melts at a low temperature. More specifically, the freed first metallizing layer forming the base metallization is covered with a further metallization layer for forming the solderable final metallization. For example, liquid tin is applied onto the copper layer of the base metallization by means of a hot air tinning in that the support body is immersed in liquid tin, whereby all areas freed of the passivating layer are covered with the further metallizing layer. Subsequently, the support body and thus the applied further metallizing layer, may be blow treated for equalizing the surface, for example by means of pressurized air.

An electrically insulating layer may be applied onto the bottom side of the support body which is covered completely with the passivating layer, particularly an electrically insulating thermally conductive layer may be applied in tight surface bonding and free of any air gaps, for example a layer of a heat conductive paste or a film forming an insulating, but thermally conductive film may be applied. For an external heat removal the support body may be attached to a metallic cooling body, for example an aluminum plate which can transfer the power loss of the electronic package to a cooling system. Hereby, the support body can be separated from the cooling body through the electrical insulating layer in a potential sense.

Following the application of the further metallizing layer forming the final metallization, the components of the circuit arrangement are soldered to the top side of the support body, for example by means of a reflow soldering process. Due to the closure of the vias and due to the secure anchoring of the screening material provided in the vias for the closure of the vias, contaminations of the bottom side of the support body can be avoided, particularly contaminations caused by a through flow of solder from the top side to the bottom side of the support body through the vias. The heat transport from the top side to the bottom side of the support body is not impaired by the screen printing material closing the vias and by the passivating layer applied to the bottom side of the support body.

In connection with the present safe and simple method for producing an electronic package, it is possible to advantageously prevent, at low costs, for all electrical and thermal vias provided in the support body, the flow of solder through the vias during soldering processes including a plurality of solderings through the vias and even where low melting material for the metallization is used. The complete prevention of such throughflow is independent of the construction of the vias and independent of the type of the vias even where the vias have larger diameters, for example a vias diameter in the range of 0.2 mm to 1.2 mm and without any impairment of the thermal transition from the top side to the bottom side of the carrier body, (there is a small thermal impedance on the top side of the support body). Simultaneously the bottom side of the support body is prepared for further method steps in the production of the electronic package in a simple manner, for example for the application of an insulation film and/or of a cooling body. Furthermore, a corrosion protection is provided for the base metallization formed by the first metallizing layer.

BRIEF DESCRIPTION OF THE DRAWINGS

The method shall be described in the following with reference to an example embodiment and in connection with the drawing, wherein:

FIG. 2 shows a sectional illustration of a thermal via in a detailed view; and

FIG. 3 shows a sectional illustration of an electrical via in a detailed view.

Figure 1:
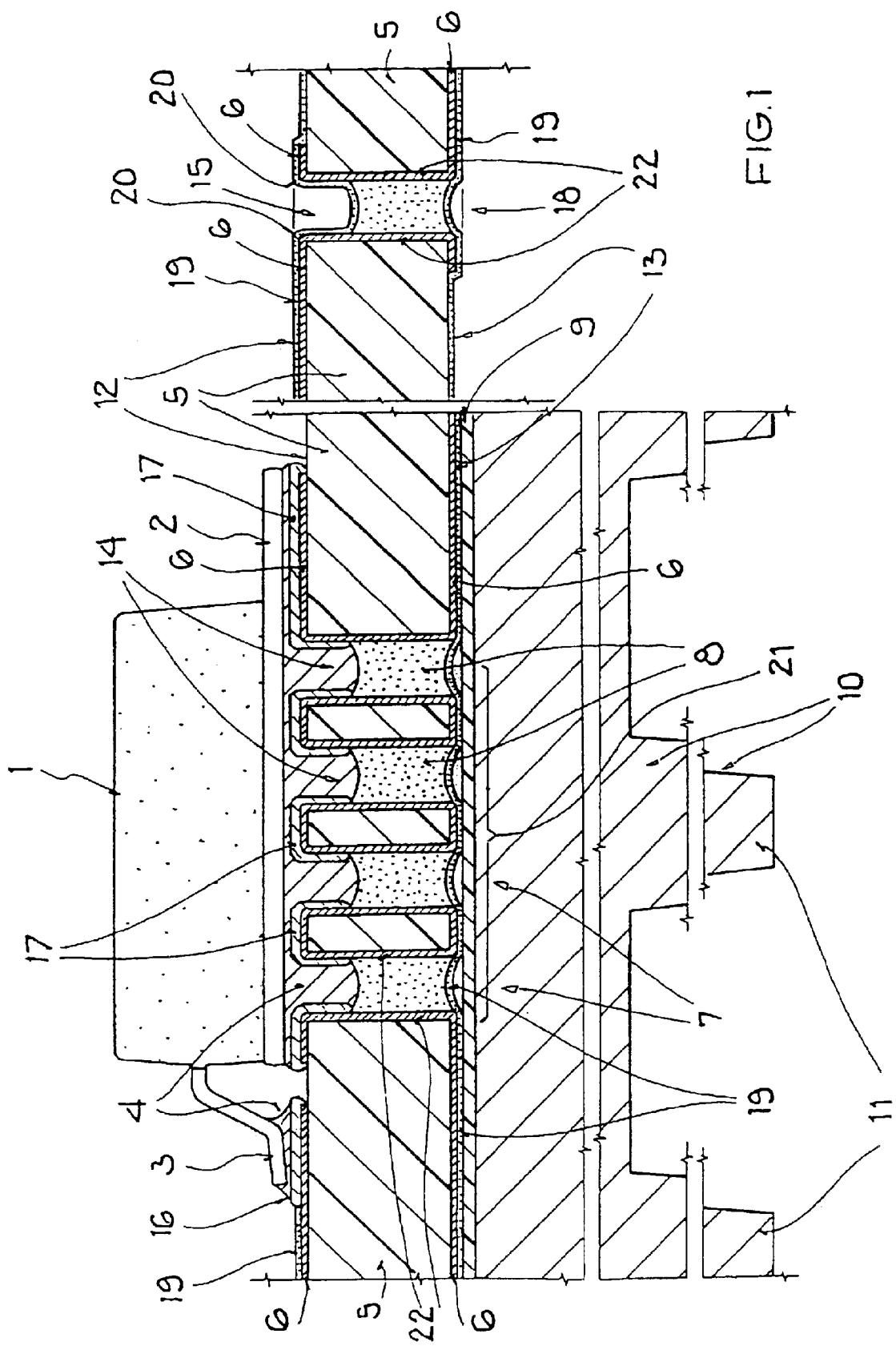
FIG. 1 shows a sectional view of the electronic package with a portion of the circuit arrangement applied to the support body including vias from the top side to the bottom side of the carrier body.

DETAILED DESCRIPTION OF A PREFERRED EXAMPLE EMBODIMENT AND OF THE REST MODE OF THE INVENTION

The circuit arrangement of the electronic package arranged on the top side 12, for example of a printed circuit board formed as a carrier body 5, comprises in addition to further active and passive electronic components also at least one power component 1, the connector contacts 3 of which are to be contacted through the connector pad 16 with the printed circuit structure applied to the printed circuit board 5. Furthermore, electrical vias 18 as well as thermal vias 7 are provided to pass from the top side 12 of the printed circuit board 5 to the bottom side 13 of the printed circuit board 5. The vias 7, 18 may, for example have a diameter in the range of 0.2 mm to 1.2 mm. Bores constructed as lead-throughs are introduced into the printed circuit board 5 for forming the vias 7 and 18. The wall surfaces 22 of the vias are completely and over the entire surface covered with a first metallization layer 6, for example of copper, for realizing the printed circuit structure. Following the application of the first metallizing layer, the openings 14, 15 have a diameter, for example of 0.5 mm. The thermal vias 7 are thereby respectively arranged in arrays 21, whereby one array 21, for example comprises 64 thermal vias 7 on a surface of 9.5 mm×9.5 mm. Particularly, at least one such array 21 of thermal vias 7 is provided for the vertical discharge of the dissipation power generated in the operation of the electronic package, particularly by the power component 1 of the circuit arrangement, in the area of each of the power components 1 of the circuit arrangement. For this purpose the power components 1 rest with their cooling vane 2 on the top side 12 of the printed circuit board 5 on the openings 14 of the thermal vias 7 so that an efficient heat transfer from the top surface 12 of the printed circuit board 5 to the bottom side 13 of the printed circuit board 5 becomes possible. The dissipation loss is discharged from the bottom side 13 of the printed circuit board 5 by means of the cooling body 10 provided with cooling ribs 11, for example made as a cooling sheet metal cooling body 10 to a cooling system. To provide an electrical isolation, a thermally conducting, electrically insulating film 9, (insulating film or heat conducting film) is arranged between the bottom side 13 of the printed circuit board 5 and the cooling sheet metal acting as cooling body 10.

For example, the components of the circuit arrangement shall be soldered to the top side 12 (the insertion side) of the printed circuit board 5 by means of a reflow soldering process. In order to prevent, during soldering the components on the top side 12 of the printed circuit board 5, a throughflow of solder 4 from the top side 12 of the printed circuit board 5 to the bottom side 13 of the printed circuit board 5, the vias 7 and 18 are closed from the bottom side 13 of the printed circuit board 5 by means of a screen printing process. The screen printing process is applied prior to the soldering process and following the application of the first metallization layer 6 forming the base metallization, for example of copper with a layer thickness of 70 µm for forming, on the one hand, on the surface of the printed circuit board 5 the printed circuit conductor structure with printed circuit conductors and contact pads, and on the other hand, into the openings 14 and 15 of the lead-throughs for the formation of the vias 7 and 18. For this purpose a screen printed film is applied around the openings 14 and 15 of the vias 7 and 18 on the bottom side 13 of the printed circuit board 5, said openings having a diameter of, for example 0.5 mm. The screen printing material 8, for example a solid epoxy material free of solvents, for example a solid epoxy resin, is printed by a multi-stage printing operation as a wet-in-wet-printing, for example by a two stage printing operation as a double printing in such a way, from the bottom side 13 of the printed circuit board 5 into the openings 14, 15 of the vias 7 and 18, that a certain filling volume in the openings 14, 15 of the vias 7, 18 is achieved. More specifically, there shall be a minimal filling height of the screen printing material 8 in the vias 7 and 18 and a minimal surface area coverage of the openings 14 and 15 of the vias 7 and 18. Particularly, the surfaces of the openings 14 and 15 of the vias 7 and 18 shall be completely filled and a filling height of at least 50% of the height of the openings 14 and 15 and thus of the thickness of the printed circuit board 5 shall be achieved. The cured screen printing material 8 shall not have any defects, for example inclusions, air bubbles, pores, and so forth. Further, no printed circuit material 8 shall contaminate the top surface 12 of the printed circuit board 5, namely the insertion side, and shall not flow through the openings 14 and 15 of the vias 7.

After the curing of the screen printing material 8, the screen printing material 8 present on the surface of the bottom side 13 and on the top side 12 of the printed circuit board 5 is removed by means of a chemical and/or mechanical cleaning process, whereby a mechanical brush polishing that is used in the production of printed circuit boards, may be used as a mechanical cleaning process. Particularly the screen printing material 8 protruding from the openings 14 and 15 and in the area of the openings 14 and 15 on the bottom side 13 and on the top side 12 of the printed circuit board 5 must be removed. This cleaning process is performed, for example for 30 seconds so that the screen printing material 8 is completely removed, for example when a maximal protrusion of the screen printing material 8 on the surface of the bottom side 13 of the printed circuit board 5 having a thickness of 100 µm is present. This cleaning prepares the metallizing layer 6 for the further method steps without impairing the screen printing material 8 present in the vias 7 and 18.

A soldering stop lacquer is applied to the entire surface of the top side 12 of the printed circuit board 5 and of the bottom side 13 of the printed circuit board 5 to form a passivating layer 19 as a corrosion protection. The soldering stop lacquer 19 thus covers the first metallizing layer 6 forming the base metallization as well as the printed circuit material 8 in the openings 14 and 15 of the vias 7 and 18 and the areas of the printed circuit board 5 that are not covered by the first metallizing layer 6. For example, a low viscosity, diluted, solvent containing solid body epoxy resin is applied as a soldering stop lacquer 19 in a screen printing method, or a curtain casting method or by a spray method. The layer thickness of the soldering stop lacquer 19 is, for example, maximally 45 µm on the surface of the top side 12 of the printed circuit board 5 and the underside 13 of the printed circuit board 5 including still present remainders of any screen printing material 8. The thickness along the edges 20 of the openings 14 and 15 of the vias 7 and 18 is, for example, minimally 3 µm. Hereby, on the one hand a sufficient heat transfer from the top side 12 of the printed circuit board 5 to the bottom side 13 of the printed circuit board 5 and on the other hand a sufficient corrosion protection for the first metallization layer 6 forming the base metallization, is assured.

The soldering stop lacquer 19 is removed from the top side 12 of the printed circuit board 5 from the areas that are intended for the soldering process. The removal can be accomplished, for example by a selective etching process, particularly from the openings 14 of the thermal vias 7 and from the area of the thermal vias 7 as well as from the connector pads 16 for the soldering and contacting of the components 1 of the circuit arrangement. Thus, the first metallization layer 6 lies free on the surface in these areas. A further metallization layer 17 forming a final metallization is applied to all accessible areas on the top side 12 of the printed circuit board 5, namely the areas on the top surface 12 of the printed circuit board 5 on which the soldering stop lacquer 19 has been removed, i.e. on the first metallization layer 6 forming the base metallization. For example, a liquid tin lead alloy can be applied by means of a hot air tinning operation, whereby the printed circuit board is immersed into a bath of a mixture of liquid tin and lead, whereby all unprotected areas not covered by a soldering stop lacquer 19 on the top side 12 of the printed circuit board 5 are covered with the further metallization layer 17. This further metallization layer 17 has, for example, a layer thickness of 1 $\mu$m to 40 $\mu$m. The surface area of the further metallization layer is made plane by blowing with pressurized air.

An electrically insulating, thermally conducting film 9 is applied to the entire surface of the bottom side 13 of the printed circuit board 5 in a surface bonding manner, for example a heat conductor film with a thickness of 150 $\mu$m is applied. Further, on the bottom side 13 of the printed circuit board 5 the metallic cooling body 10 provided with cooling ribs and formed as a cooling sheet metal is separated from the printed circuit board by the insulating film 9 for an electrical insulation.

The components 1 of the circuit arrangement are soldered to the top surface on the top side 12, namely to the insertion side of the printed circuit board 5, for example by means of a reflow soldering process. In this process, the areas of the openings 14 and 15 of the vias 7 and 18 which are not filled with screen printing material are filled up with solder 4 without the solder 4 being able to reach to the bottom side 13 from the top side 12 of the printed circuit board 5, whereby the circuit components 1 of the circuit arrangement are electrically conducting connected with the contact pad 16 and thus with the printed circuit structure.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method for producing an electronic package with a circuit arrangement secured to a support body and at least one electronic component, comprising the following steps:
    a) forming lead-throughs in the support body;
    b) applying to the support body a first metallizing layer forming the base metallization for the formation of a conductor structure, and to the openings of the lead-throughs for the formation of thermal vias and electrical vias,
    c) closing the vias, from the bottom side of the support body by means of a screen printing process with highly viscous screen printing material,
    d) applying a low viscous passivating layer on the entire surface of the top side and the bottom side (13) of the support body,
    e) selectively removing the passivating layer from certain areas on the top side of the support body,
    f) applying a second metallizing layer to the first metallizing layer in the areas freed of the passivating layer, said second metallizing layer forming the final metallization of a material having a low melting point,
    g) applying and contacting by a soldering process the at least one electronic component of the circuit arrangement on the top side of the support body.

2. The method of claim 1, characterized in that the remainders of the screen printing material which protrude on the bottom side and/or on the top side of the support body are removed by at least one cleaning process, following the screen printing process and the curing of the screen printing material.

3. The method of claim 2, characterized in that the at least one electronic component of the circuit arrangement is applied and contacted on the top side of the support body by a reflow soldering process.

4. The method of claim 1, characterized in that a soldering stop lacquer is applied as a low viscous passivating layer to the entire surface of the top side and of the bottom side.

5. The method of claim 4, characterized in that the at least one electronic component of the circuit arrangement is applied and contacted on the top side of the support body by a reflow soldering process.

6. The method of claim 1, characterized in that the at least one electronic component of the circuit arrangement is applied and contacted on the top side of the support body by a reflow soldering process.

7. The method of claim 1, characterized in that a thermally conductive, electrically insulating film is applied to the bottom side of the support body.

8. The method of claim 7, characterized in that the thermally conductive, electrically insulating film is connected with a cooling body.

* * * * *

UNITED STATES PATENT AND TRADEMARK OFFICE
CERTIFICATE OF CORRECTION

PATENT NO.    : 6,929,975 B2
DATED         : August 16, 2005
INVENTOR(S)   : Heinz et al.

It is certified that error appears in the above-identified patent and that said Letters Patent is hereby corrected as shown below:

Title page,
Item [56], References Cited, U.S. PATENT COUMENTS, replace "McMillan et al." with -- McMillan II, et al. --;
Item [57], ABSTRACT,
Line 8, after "second" replace "metailizing" with -- metallizing --.

Column 1,
Line 6, after "application" (second occurrence), delete "Ser. No.";
Line 7, after "U.S.", replace "Pat. No." with -- Patent --;

Column 4,
Line 64, after "OF THE" replace "REST" with -- BEST --;

Column 8,
Line 4, after "vias" delete ",";
Line 8, after "side" (second occurrence) delete "(13)".

Signed and Sealed this

Seventh Day of February, 2006

JON W. DUDAS
*Director of the United States Patent and Trademark Office*